United States Patent
Kriman et al.

(10) Patent No.: US 7,906,364 B2
(45) Date of Patent: Mar. 15, 2011

(54) METHODS FOR MANUFACTURING A SENSOR ASSEMBLY

(75) Inventors: Moshe Kriman, Tel-Aviv (IL); Merav Yaakoby, Kfar-Saba (IL)

(73) Assignee: N-trig Ltd., Kfar-Saba (IL)

( * ) Notice: Subject to any disclaimer, the term of this patent is extended or adjusted under 35 U.S.C. 154(b) by 823 days.

(21) Appl. No.: 11/791,749

(22) PCT Filed: Nov. 29, 2005

(86) PCT No.: PCT/IL2005/001271
§ 371 (c)(1),
(2), (4) Date: May 29, 2007

(87) PCT Pub. No.: WO2006/056999
PCT Pub. Date: Jun. 1, 2006

(65) Prior Publication Data
US 2007/0292983 A1    Dec. 20, 2007

Related U.S. Application Data

(60) Provisional application No. 60/631,254, filed on Nov. 29, 2004.

(51) Int. Cl.
*H01L 21/00* (2006.01)

(52) U.S. Cl. .......... 438/66; 29/830; 29/842; 29/846; 29/605; 29/602.1; 257/780; 257/737; 174/262; 438/118

(58) Field of Classification Search .......... 29/830, 29/842, 846, 605, 606, 602.1, 876; 257/780, 257/737; 174/262; 438/66, 118; 439/119
See application file for complete search history.

(56) References Cited

U.S. PATENT DOCUMENTS

| 4,607,779 | A | * | 8/1986 | Burns ............................ 228/106 |
| 5,136,125 | A | | 8/1992 | Russell et al. |
| 5,700,715 | A | * | 12/1997 | Pasch ............................ 438/613 |
| 5,941,449 | A | | 8/1999 | Le Coz et al. |
| 6,281,452 | B1 | * | 8/2001 | Prasad et al. .................. 174/262 |
| 6,569,753 | B1 | * | 5/2003 | Akram et al. ................. 438/612 |
| 6,621,168 | B2 | * | 9/2003 | Sundahl et al. ............... 257/778 |
| 6,690,156 | B1 | | 2/2004 | Weiner et al. |
| 6,773,957 | B2 | * | 8/2004 | Farnworth et al. ............ 438/107 |
| 7,566,649 | B2 | * | 7/2009 | Bernier et al. ................ 438/612 |
| 2004/0095333 | A1 | | 5/2004 | Morag et al. |
| 2007/0292983 | A1 | | 12/2007 | Kriman et al. |

FOREIGN PATENT DOCUMENTS

| DE | 4242408 | 6/1993 |
| EP | 0710058 | 1/1996 |
| EP | 0710058 | 5/1996 |
| WO | WO 2006/056999 | 6/2006 |

OTHER PUBLICATIONS

International Preliminary Report on Patentability Dated Mar. 12, 2007 From the International Preliminary Examining Authority Re.: Application No. PCT/IL2005/001271.

International Search Report and the Written Opinion Dated Jul. 31, 2006 From the International Searching Authority Re.: Application No. PCT/IL2005/001271.

* cited by examiner

*Primary Examiner* — Derris H Banks
*Assistant Examiner* — Azm Parvez

(57) ABSTRACT

A method for connecting substrates having electrical conductive elements thereon, comprising: providing at least one spacer between the substrates; applying a conductive material to at least one of the electrical conductive elements; aligning the electrical conductive elements; and, connecting the substrates by urging them together, wherein the at least one spacer prevents lateral spreading of the conductive material on the substrates from bridging a distance between adjacent conductive elements during the connecting.

12 Claims, 10 Drawing Sheets

METHODS FOR MANUFACTURING A SENSOR ASSEMBLY

RELATED APPLICATIONS

This Application is a National Phase of PCT Patent Application No. PCT/IL2005/001271 having International Filing Date of Nov. 29, 2005, which claims the benefit of U.S. Provisional Patent Application No. 60/631,254 filed on Nov. 29, 2004. The contents of the above Applications are all incorporated herein by reference.

FIELD OF THE INVENTION

The present application is concerned with methods for manufacturing a sensor assembly.

BACKGROUND OF THE INVENTION

Existing methods of creating electrical and mechanical contacts between conductive pads include soldering, using anisotropic conductive paste ("ACP") or film ("ACF"), and conductive adhesives.

Soldering is commonly used in the electronics industry. However, in order to create a good electric contact both pads are heated to relatively high temperatures. This method is unsuitable when the electric pads are part of polymeric substrates, such as a PET foil, due to the relatively high temperatures required to practice this option.

Anisotropic conductive materials, such as ACF or ACP, are common alternatives for soldering. ACP/ACF works by trapping conductive particles between the corresponding conductive pads. An exemplary prior art method of using an anisotropic material is shown in FIGS. 1A and 1B. Referring to FIG. 1A, a pre-bonding step is shown. During the pre-bonding step, an ACF or ACP 102 is placed between a PET foil 104 and a printed circuit board ("PCB") substrate 106. The ACF/ACP 102 consists of conductive particles 108 dispersed within a non-conductive epoxy/adhesive. The electric pads 110 on PCB substrate 106 and PET foil 104 are slightly elevated from the surface. The bonding step consists of applying pressure and heat across the top surface of the PCB substrate 106. As seen in FIG. 1B, after the bonding process, some of the conductive particles are trapped between the electric pads 110 of PCB substrate 106 and the electric pads 114 of the PET foil 104. The trapped particles form an electric contact in the vertical direction. The conductive particles in the medium 112 between the electric pads are distributed in a way that doesn't allow electrical contact in the lateral direction. After the bonding process, the epoxy material 102 is cured and the conductive particles are locked in their compressed position. The curing technique depends on the anisotropic conductive material.

In order to ensure sound electrical contacts, the bonding process must provide an even amount of heat and pressure across the entire surface of the top substrate 106. These requirements lead to some of the ACF/ACP major disadvantages including:

1. the PCB substrate 106 has to be of limited dimensions in order to ensure an even distribution of pressure and heat;
2. the top surface of the PCB substrate 106, opposite the electric pads 110, has to be smooth;
3. at least one of the substrates 104, 106 has to be thin and flexible;
4. high stress levels do not allow assembling of brittle parts; and,
5. the typical curing temperature of the ACF/ACP 102 is greater than 120° C., which is still relatively high.

These disadvantages make it impossible to use ACF/ACP on uneven surfaces such as rigid PCB boards assembled with electronic components because standard bonding machinery supports limited surface areas and specific geometries. In addition the ACF/ACP will not allow assembly at low temperature.

A third alternative for creating electrical and mechanical contacts between electric pads includes using a conductive adhesive. However, the use of a conductive adhesive, such as Epo-Tek E4110, is very likely to result in lateral conductance. Lateral conductance is undesirable because it causes a short circuit between the electric pads. FIG. 2 shows an attempt to use a conductive adhesive 202 in order to electrically connect the electric pads 204 on a first substrate 206 to the electric pads 208 on a second substrate 210. Applying even a small amount of pressure to the first substrate 206 will cause the adhesive 202 to spread sideways, in which case, undesirable lateral conductance is likely to occur.

SUMMARY OF THE INVENTION

An aspect of some embodiments of the invention relates to methods for creating electrical and mechanical contacts between electrical components, having located thereon electrical pads, using a conductive material, such as adhesive, while avoiding the risk of creating lateral conductance between the pads. In an exemplary embodiment of the invention, the electrical pads are located on polymeric/heat sensitive substrates, such as PET foils, as well as brittle components, such as PCBs. In some exemplary embodiments of the invention, at least one non-conductive spacer is used to avoid creating lateral conductance between the pads. Optionally, the non-conductive spacer is located on a PCB. Optionally, the non-conductive spacer is located on a sensor. Optionally, a conductive adhesive is applied to the pads subsequent to the placement of the non-conductive spacer. The spacer is operative, in some embodiments of the invention, to act as a blocking element to stop lateral flow of the conductive epoxy.

In some exemplary embodiments of the invention, a conductive spacer is used as part of the contact mechanism, avoiding any lateral conductance between the pads. Optionally, at least one conductive spacer is placed on a pad. Since for use as a spacer, the conductive spacer is required to be coherent and, when conductive epoxy is used, should be cured before assembly, optionally a supplemental coating of a conductive adhesive is placed on the conductive spacer prior to assembly. Since the spacer is conductive and forms part of the contact, only a small amount of epoxy is used, making it easier to avoid lateral flow to the next spacer.

In an exemplary embodiment of the invention, electric pads are mated by placing their respective substrates in proximity to each other such that the electric pads match up. Optionally, weight and/or pressure are used to force the two substrates together. Optionally, planarization of the substrates is achieved by using the weight and/or pressure in combination with the spacers. Optionally, the height of a gap between the two substrates is determined by the height of the spacers. In an exemplary embodiment of the invention, gaps between the two substrates being mated together are filled in with a non-conductive material.

An aspect of some exemplary embodiments of the invention relates to methods of manufacturing a sensor assembly. Optionally, the sensor assembly is a component of a digitizer, a personal computer, a personal data assistant or a mobile phone. In an exemplary embodiment of the invention, a sensor array and at least one PCB are connected together electrically and/or mechanically while avoiding creating lateral conductance between electrical pads located thereon. In an exemplary embodiment of the invention, the connected sensor array and at least one PCB are secured within a frame. Optionally, the frame provides mechanical stability to the sensor assembly. Optionally, the frame provides a recess for locating a peripheral coil. In some exemplary embodiments of the invention, the frame is provided with alignment extensions to assist with aligning the frame with another object, such as an LCD screen. In an exemplary embodiment of the invention, a peripheral coil is placed within the recess of the frame. Optionally, the peripheral coil is constructed of a conductive material, such as copper. Optionally, the peripheral coil is wound about the frame in order to position it within the recess. Optionally, one end of the peripheral coil is connected to a first set of electrical pads and a second end of the peripheral coil is connected to a second set of electrical pads. In an exemplary embodiment of the invention, the sensor array, PCB, frame and peripheral coil are encapsulated in a non-conductive material to improve the mechanical stability of the assembly and to help secure the peripheral coil in place.

There is thus provided in accordance with an exemplary embodiment of the invention, a method for connecting substrates having electrical conductive elements thereon, comprising: providing at least one spacer between the substrates; applying a conductive material to at least one of the electrical conductive elements; aligning the electrical conductive elements; and, connecting the substrates by urging them together, wherein the at least one spacer prevents lateral spreading of the conductive material on the substrates from bridging a distance between adjacent conductive elements during the connecting. In some exemplary embodiments of the invention, the method further comprises filling in gaps between the substrates. Optionally, the gaps are filled in with a non-conductive adhesive. Optionally, at least one of the substrates is a PCB. Optionally, at least one of the substrates is a sensor array. Optionally, at least one spacer is non-conductive. Optionally, at least one spacer is conductive. Optionally, at least some of the conductive spacers are comprised in the conductive elements. Optionally, at least one non-conductive spacer is planar. Optionally, at least one non-conductive spacer is elongate. Optionally, the planar spacer prevents lateral spread by blocking the spread. Optionally, at least one spacer determined a distance between the substrates. In some exemplary embodiments of the invention, at least one conductive spacer is comprised of a cured conductive material. Optionally, the electrical conductive elements are pads. Optionally, urging is performed by a weight. Optionally, the urging planarizes at least one of the substrates by conforming the electrical component to the at least one spacer. In some exemplary embodiments of the invention, the conductive material is a conductive adhesive.

There is thus provided in accordance with an exemplary embodiment of the invention, a method for manufacturing a sensor assembly, comprising: connecting at least two substrates having electrical connections thereon, matching connections on adjacent substrates being connected by conductive epoxy, wherein the substrates are provided with at least one spacer to avoid lateral conduction between adjacent connections on a same substrate; and, adding a frame, wherein the frame provides additional mechanical stability to the connected substrates. In an exemplary embodiment of the invention, the method further comprises providing a peripheral coil. Optionally, the peripheral coil is situated in a recess located on the frame. In an exemplary embodiment of the invention, the method further comprises encapsulating the assembly with a non-conductive adhesive. In an exemplary embodiment of the invention, the method further comprises integrating the sensor assembly with another device. Optionally, the peripheral coil is wound around the frame. Optionally, encapsulating includes filling in any gaps between the electrical components and the frame. Optionally, encapsulating further includes filling in the recess wherein the peripheral coil is situated. In an exemplary embodiment of the invention, integrating occurs with at least one of a personal computer, a mobile phone, a digitizer or a personal data assistant. In an exemplary embodiment of the invention, the method further comprises providing a hard protective layer on top of at least one of the substrates.

BRIEF DESCRIPTION OF THE DRAWINGS

Exemplary non-limiting embodiments of the invention are described in the following description, read with reference to the figures attached hereto. In the figures, identical and similar structures, elements or parts thereof that appear in more than one figure are generally labeled with the same or similar references in the figures in which they appear. Dimensions of components and features shown in the figures are chosen primarily for convenience and clarity of presentation and are not necessarily to scale. In the attached figures.

DETAILED DESCRIPTION OF EXEMPLARY EMBODIMENTS

The present invention is best understood when described in conjunction with position detecting systems, such as a digitizer or touch screen. U.S. Pat. No. 6,690,156 and U.S. patent application Ser. No. 10/649,708, entitled "Transparent Digitizer", the disclosures of which are herein incorporated by reference, describe positioning detecting devices located on top of a flat screen display. Some of the exemplary embodiments in both disclosures describe a sensor assembly built of transparent foils containing a matrix of vertical and horizontal conductors. Optionally, the sensor assembly is for use with at least one of: a tablet personal computer (tablet "PC"), a lap-top PC, a personal data assistant ("PDA") or any hand held device such as a mobile phone. The exemplary embodiments described herein are suitable for manufacturing such a sensor assembly.

Figure 1A:
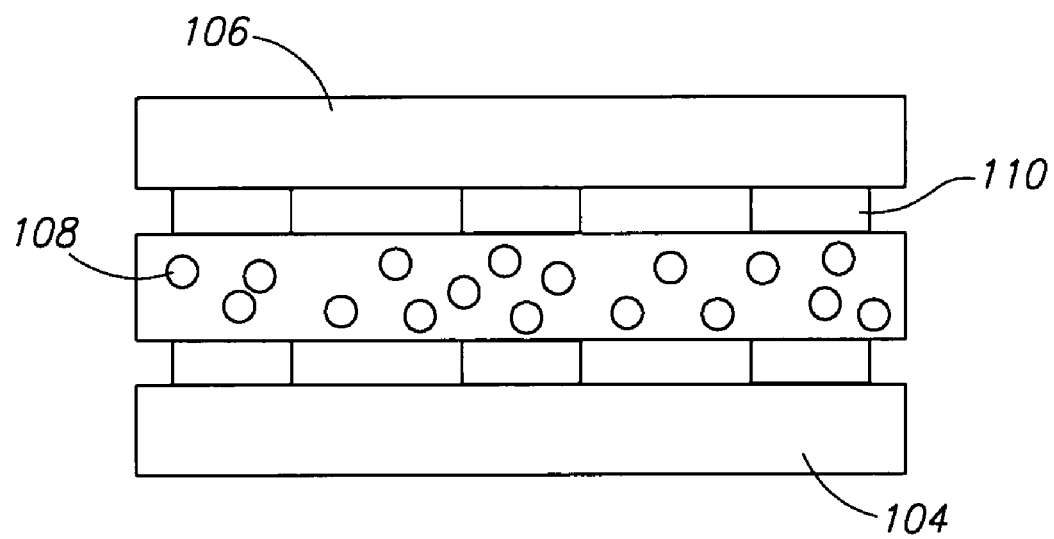
FIG. 1A is a schematic showing a prior art pre-bonding step using anisotropic conductive materials.
Figure 1B:
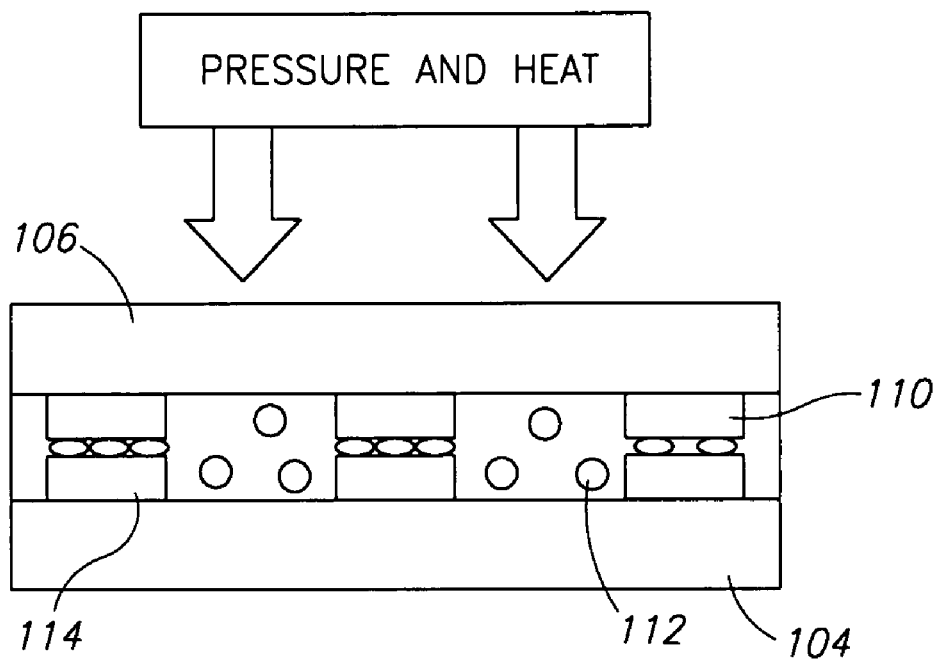
FIG. 1B is a schematic showing a prior art post-bonding step using anisotropic conductive materials.
Figure 2:
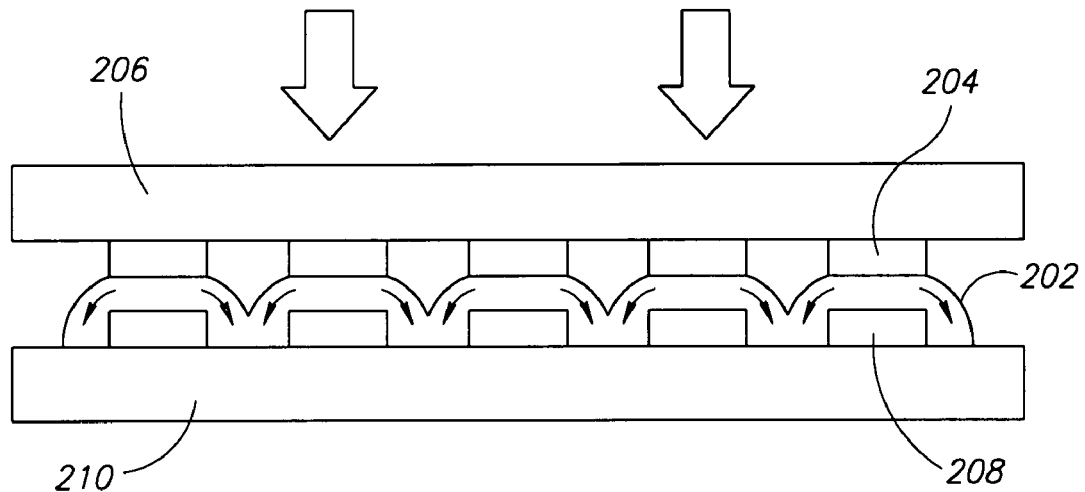
FIG. 2 is an illustration showing a prior art disadvantage of using conductive adhesive.
Figure 3:
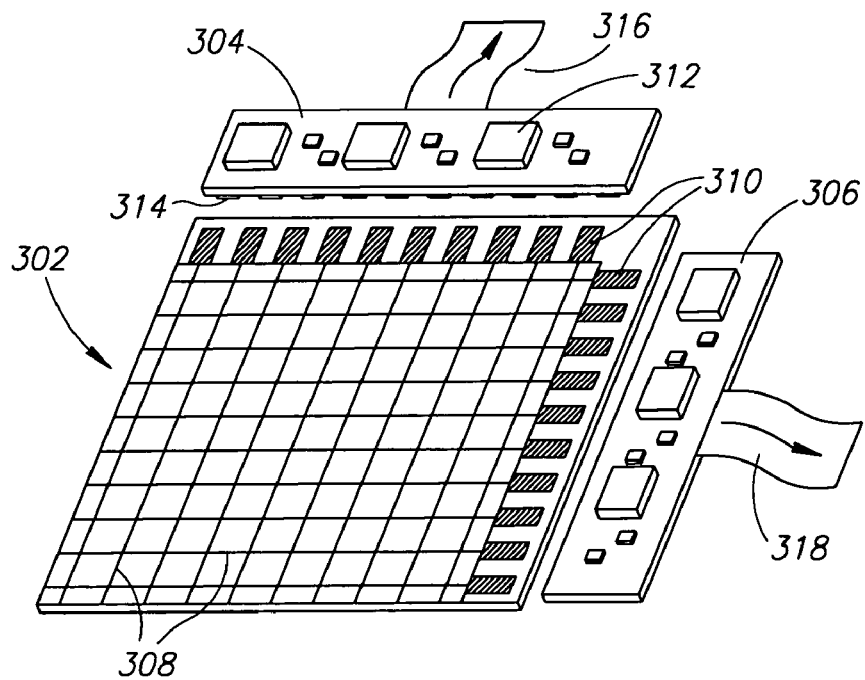
FIG. 3 is a schematic showing a sensor array and PCBs prior to connection, in accordance with an exemplary embodiment of the invention.

Referring to FIG. 3, an exemplary sensory array 302 is shown in proximity to a first PCB substrate 304 and a second PCB substrate 306. In an exemplary embodiment of the invention, sensor array 302 is manufactured on a substrate, which is typically a transparent material such as glass or plastic. Optionally, sensor array 302 is comprised of transparent PET foils, each patterned with conductive antennae 308. Optionally, conductive antennae 308 are made of ITO or other transparent organic conductors. The transparent foils are combined to create a grid of conductive antennae 308. Optionally, each conductive antenna 308 is connected to or formed with one of a plurality of electrical conductive elements, such as electric pads 310, at or near the edge of the foils. Optionally, the electric pads are made of graphitic or silver material. First PCB substrate 304 is assigned to the x-axis antennae and second PCB substrate 306 is assigned to the y-axis antennae, in accordance with an exemplary embodiment of the invention. Optionally, more or less PCBs are used depending on the configuration of the sensor array or functionality considerations. Optionally, flex circuits are used instead of PCB substrate 304.

In an exemplary embodiment of the invention, a first PCB substrate 304 and a second PCB substrate 306 are provided with electronic components 312 of various shapes and heights on one side and electric pads 314 on the opposite side. In an exemplary embodiment of the invention, electric pads 314 face electric pads 310 of sensor array 302. PCB substrates 304, 306 are optionally narrow, thin and of an elongated rectangular shape, which causes a certain curvature across its longitudinal axis. Electric pads 314 at the bottom of the PCB substrates are electrically connected to electric pads 310 on the transparent foils, in an exemplary embodiment of the invention, optionally using methods of connection as described herein. Optionally, electric pads 314 at the bottom of the PCB substrates are electrically connected to the conductive lines of the transparent foils of the sensor. Optionally, electric pads 314 are made of nickel coated with gold.

In operation, user interactions on sensor array 302 generate electric signals on conductive antennae 308. The received signals are transferred to the PCB substrates 304, 306 through the electric contacts provided by the electric pads 310, 314. PCB substrates 304, 306 are optionally electrically connected through flex cables 316, 318 to a control circuit or to a digitizer for further analysis.

Exemplary Methods for Connecting at Least One PCB to a Sensor Array

In an exemplary embodiment of the invention, at least one PCB substrate is mechanically and electrically secured to a sensor array without creating lateral conduction. There are a number of optional methods for accomplishing this securing, as described below.

Figure 4:
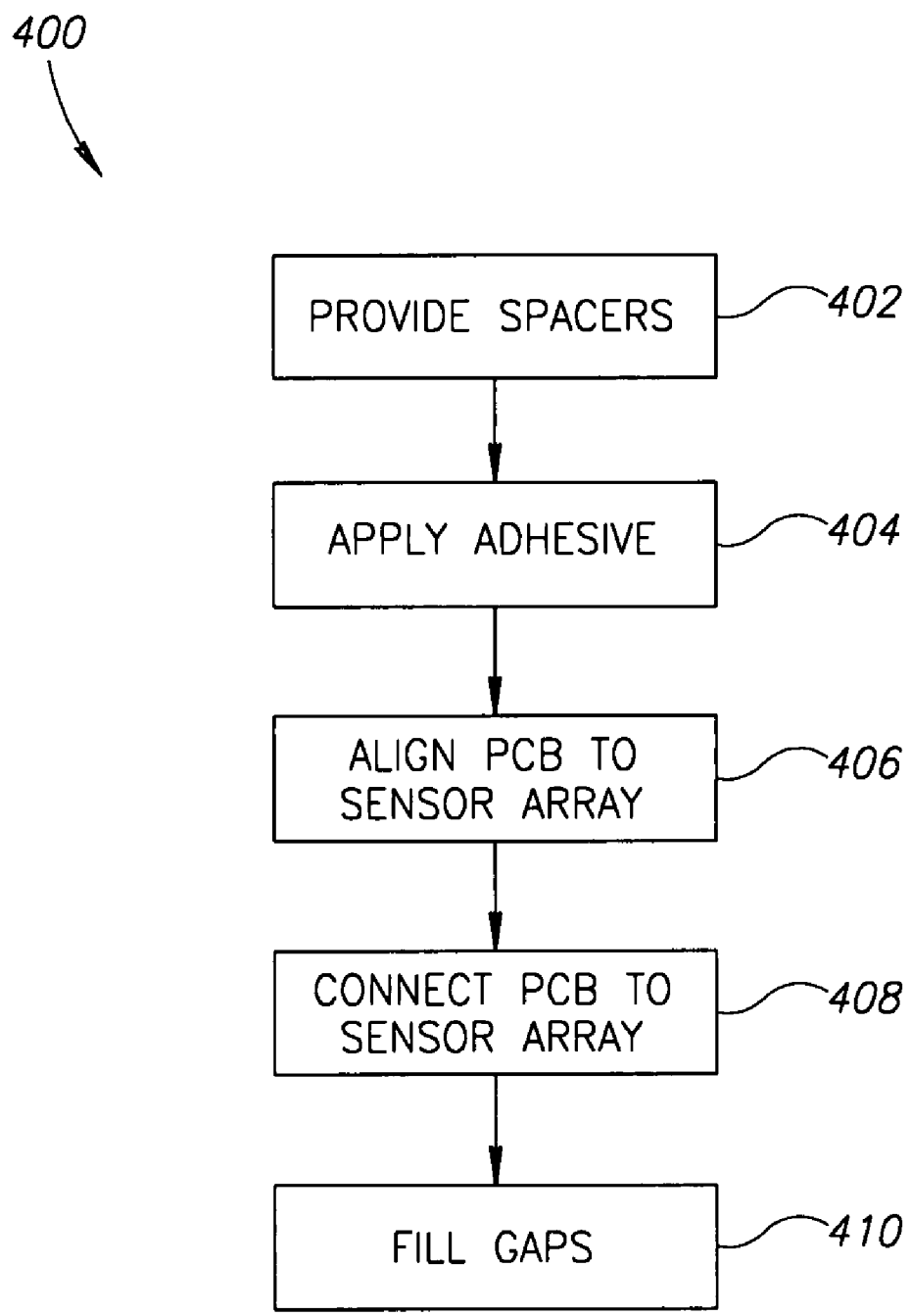
FIG. 4 is a flowchart outlining an exemplary method for connecting a PCB substrate to a sensor array, in accordance with an exemplary embodiment of the invention.

Referring to FIG. 4, a flowchart 400 outlining an exemplary method for connecting a PCB substrate to a sensor array is depicted, in accordance with an exemplary embodiment of the invention. In an exemplary embodiment of the invention, at least one spacer, and generally a plurality of spacers, optionally in a pointed pattern or in a planar shape is provided (402) to a PCB substrate and/or a sensor array. In an exemplary embodiment of the invention, the spacers are placed using a dispenser. The spacers can be non-conductive when placed on top of the PCB and/or the sensor substrate or conductive when placed on top of the electric pads of the PCB substrate and/or the sensor array, depending on which of the methods is used. Optionally, both conductive and non-conductive spacers are used. Optionally, at least one spacer is planar. In some exemplary embodiments of the invention, at least one spacer is provided with a larger height dimension than that of the electric pads located on the PCB substrate and/or sensor array.

A conductive adhesive is applied (404) to the electric pads of the PCB substrate and/or the sensor array (which may be the spacers themselves, in some embodiments of the invention). The PCB substrate to be connected to the sensor array is aligned (406) with the sensor array such that electric pads located thereon are aligned with corresponding electric pads on the sensor array. The PCB substrate and the sensor array are connected (408) by applying pressure to the PCB substrate and/or the sensor array, such that the two come together and compress the conductive adhesive located therebetween. In an exemplary embodiment of the invention, the electric pads located on the PCB substrate and the sensor array mate with a conductive connection provided by the conductive adhesive. In some exemplary embodiments of the invention, the at least one spacer avoids creation of lateral conductivity between the electric pads after a conductive adhesive is applied and pressed. Any gaps between the PCB substrate and the sensor array are filled (410) with a non-conductive material, in accordance with an exemplary embodiment of the invention.

Optionally, filling (410) is accomplished by using a capillary effect caused by the small spaces in between the PCB substrate and the sensor array.

In most of the embodiments described herein, the PCB substrates are assembled in the same general plane as the sensor array, however other embodiments may include other configurations. For example, the PCB substrates can be optionally positioned above or below the sensor array plane. Optionally, the frame (described in more detail below) has integrated PCBs and is connected directly to the sensor array.

Figure 5A:
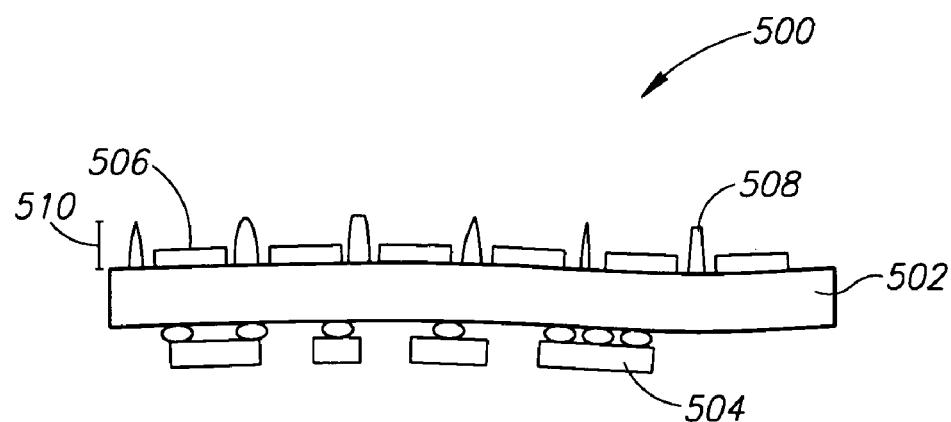
FIG. 5A is a side view of a PCB with non-conductive spacers, in accordance with an exemplary embodiment of the invention.

Referring to FIG. 5A, a side view 500 of an exemplary PCB substrate 502 is shown. Located on one side of PCB substrate 502 are various components 504 related to the functionality of PCB substrate 502. Optionally, various components 504 are of variable size, shape and/or height. Electric pads 506 are provided on the side opposite various components 504, in accordance with an exemplary embodiment of the invention. As described in the "Background of the Invention" section, application of a conductive adhesive to this structure would most likely result in creating lateral conduction. Therefore, in an exemplary embodiment of the invention, non-conductive spacers 508 are provided to PCB substrate 502 in order to avoid creating lateral conduction between electric pads 506 when a conductive adhesive is added and subsequently subjected to pressure.

Figure 5B:
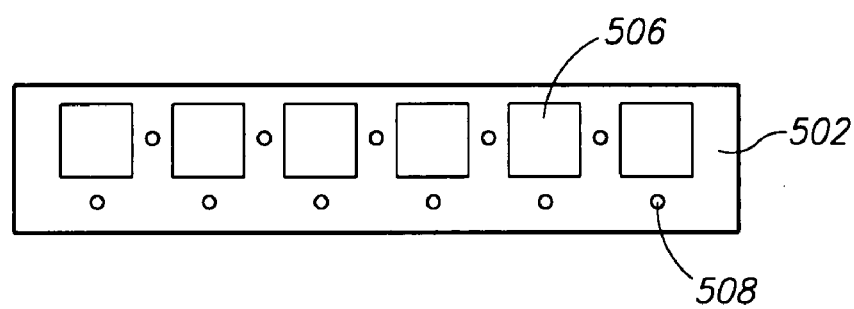
FIG. 5B is a top view of a PCB with non-conductive spacers, in accordance with an exemplary embodiment of the invention.
Figure 6:
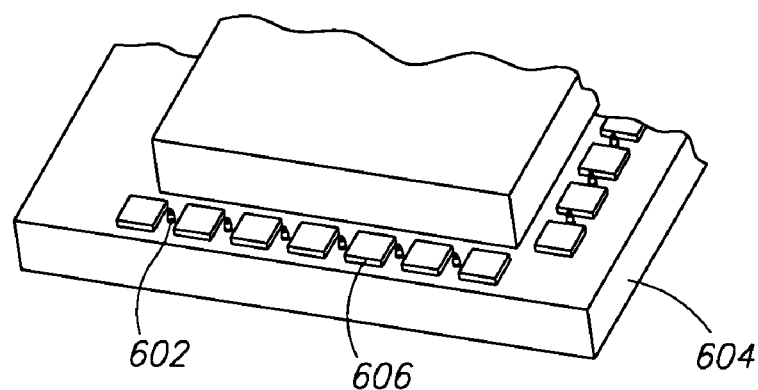
FIG. 6 is a perspective view of a sensor array with non-conductive spacers, in accordance with an exemplary embodiment of the invention.

In an exemplary embodiment of the invention, non-conductive spacers 508 are provided (402) on PCB substrate 502 in sufficient quantity to prevent lateral conduction by resisting the application of pressure to the conductive epoxy which would cause sufficient lateral flow of the epoxy to cause shorts between the pads. This would happen, in the absence of the spacers, when a sensor array, depicted in FIG. 6, is mated thereto and the two are pressed together. For example, non-conductive spacers 408 are located at least in between each of electric pad 506. Non-conductive spacers 508 are optionally provided with a height dimension 510 which is larger than that of electric pads 506, such that when the sensor array is pressed onto PCB substrate 502, non-conductive spacers 508 support the pressure rather than electric pads 506. FIG. 5B shows an exemplary configuration of non-conductive spacers 508 from a top view, in accordance with an exemplary embodiment of the invention.

FIG. 5A shows a variety of configurations for non-conductive spacers 508, and it should be understood that these configurations are by way of example only and should not be considered limiting. In some exemplary embodiments of the invention, non-conductive spacers 508 are elongate. It is also noted that PCB substrate 502 is slightly warped, as is typically the case for long, thin substrates like PCBs. In an exemplary embodiment of the invention, warped substrates do not present a manufacturing hurdle due to the use of spacers and the application of pressure.

Additionally or alternatively to providing non-conductive spacers 508 on PCB substrate 502, sensor array non-conductive spacers 602 are provided (402) on a sensor array 604, shown in FIG. 6. In an exemplary embodiment of the invention, when PCB substrate 502 and sensor array 604 are pressed together, sensor array non-conductive spacers 602 prevent a conductive adhesive located therebetween from being squashed enough to create lateral conduction between electric pads 606. Of course, since the pads are lower than the spacers, enough epoxy must be applied to fill the gap between the sensor and the PC board when the two are pressed together. However, since this amount can be relatively small it does not cause too much lateral flow.

Figure 7:
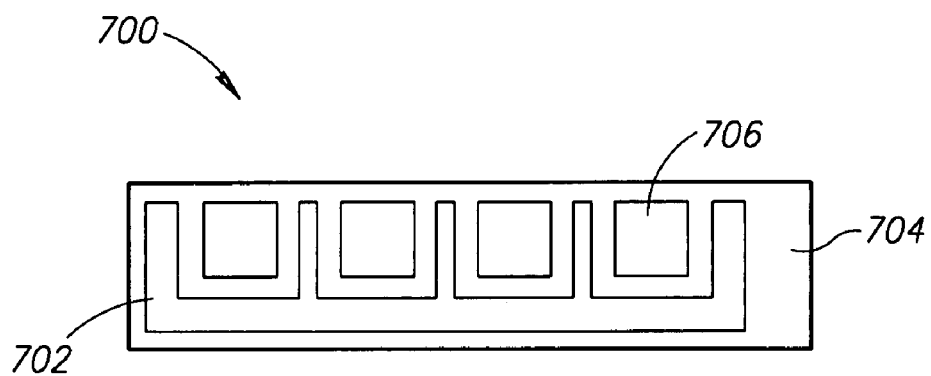
FIG. 7 is a top view of a PCB with non-conductive spacers, in accordance with an exemplary embodiment of the invention.

In an exemplary embodiment of the invention, a planar non-conductive spacer 702, shown in FIG. 7, is provided (402) additionally or alternatively to non-conductive spacers 508, 602. Planar non-conductive spacer 702 is configured to insulate electric pads 706 located on a PCB substrate 704 such that when a conductive adhesive is applied to electric pads 706, lateral conduction between electric pads 706 is blocked by the spacers. Optionally, planar non-conductive spacer 702 is a one piece element. Optionally, planar non-conductive spacer 702 is comprised of a plurality of pieces. Optionally, planar non-conductive spacers are used on sensor array 604 instead of PCB substrate 704. Optionally, planar non-conductive spacers are used on sensor array 604 and placed in a row pattern between the conductive foils. Planar non-conductive spacer 702 is optionally provided with a height dimension (not shown, in a top view 700) which is larger than that of electric pads 706, such that when sensor array 604 is pressed onto PCB substrate 704, planar non-conductive spacer 702 supports the pressure rather than electric pads 706. In a sense, the pads sit in wells (at least in one dimension) formed by the spacer. In some exemplary embodiments of the invention, planar non-conductive spacer 702 is not affixed, or does not rest upon PCB substrate 704 or sensor array 604, and instead placed in between them when they are pressed together.

Figure 8:
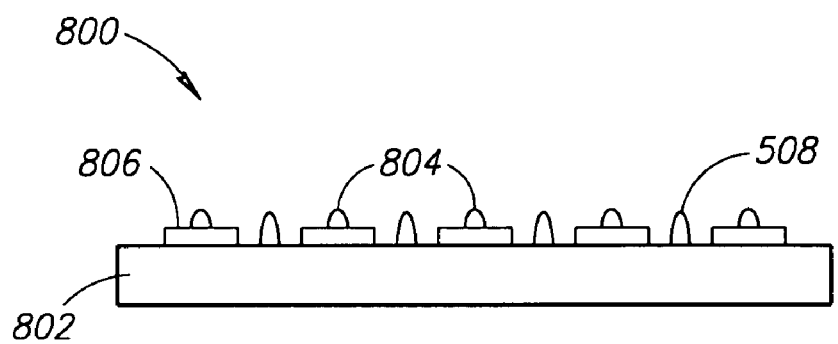
FIG. 8 is a perspective view of a sensor array with conductive spacers, in accordance with an exemplary embodiment of the invention.

Referring to FIG. 8, an exemplary side view 800 of a sensor array 802 is provided, in accordance with an exemplary embodiment of the invention. For those embodiments described herein where non-conductive spacers 906 were provided (402), a small amount of conductive adhesive 804 is applied (404) to electric pads 806, in accordance with an exemplary embodiment of the invention. Enough conductive adhesive 804 must be applied (404) to adhere sensor array 802 electric pads 806 to correlative electric pads on a PCB substrate. Furthermore, an electrical connection should be made in accordance with an exemplary embodiment of the invention. However, not so much conductive adhesive 804 should be applied (404) such that the amount of adhesive 804 overwhelms the non-conductive spacers 806 and creates lateral conduction. Optionally, conductive adhesive 804 is applied (404) to electric pads on a PCB substrate (not shown) and then the PCB substrate electric pads are mated to electric pads 906. Optionally, conductive adhesive 804 is applied (404) to both PCB substrate electric pads and electric pads 806.

Figure 9:
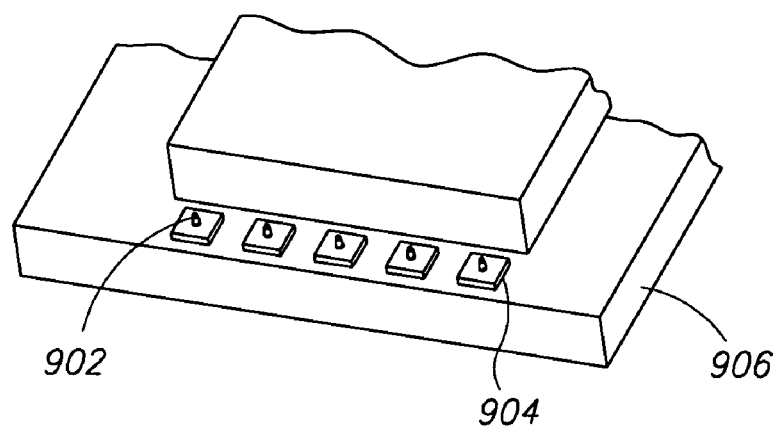
FIG. 9 is an exemplary perspective view of a sensor array provided with non-conductive spacers with conductive adhesive applied to electric pads, in accordance with an exemplary embodiment of the invention.

In some exemplary embodiments of the invention, at least one conductive spacer 902 is provided (402), as seen in FIG. 9. A measured amount of conductive adhesive is carefully placed on each electric pad 904, the electric pads 904 being located on a sensor array 906, in accordance with an exemplary embodiment of the invention. Optionally, sensor array 906 is constructed of PET foil. In an exemplary embodiment of the invention, the conductive adhesive is cured, which causes the conductive adhesive to solidify. The cured conductive adhesive becomes a conductive spacer 802 upon its solidification.

While not shown in the attached Figures, a component holder is optionally used in addition to or alternatively to the spacers described above. Optionally, the component holder is a vacuum holder. In an exemplary embodiment, the vacuum holder holds one of the components, such as the PCB substrate, a fixed distance above the sensor array. In such an embodiment, a conductive adhesive would be dispensed on the electric pads of one or both of the PCB and sensor array. The fixed distance between the PCB and sensor array helps to ensure that the conductive adhesive does not spread sideways in a way that may cause lateral conductance. The components can be moved any distance apart as is necessary after the application of the conductive adhesive for curing.

Figure 10:
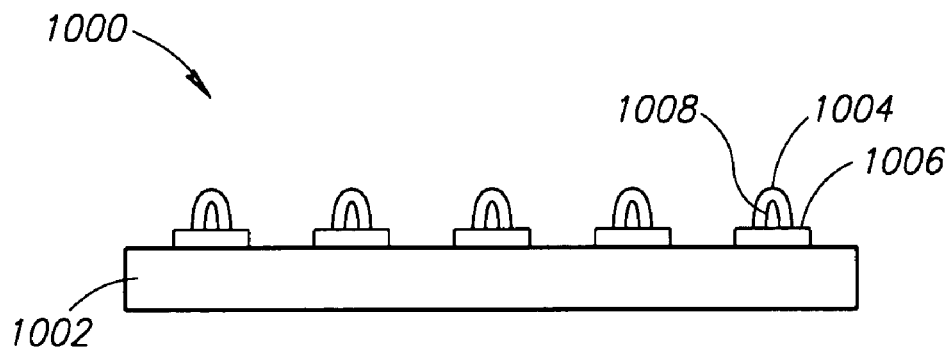
FIG. 10 is an exemplary side view of a sensor array provided with conductive spacers with conductive adhesive applied to electric pads, in accordance with an exemplary embodiment of the invention.

FIG. 10 is an exemplary side view 1000 of a sensor array 1002 provided (402) with conductive spacers 1008, in accordance with an exemplary embodiment of the invention. Optionally, conductive spacers 1002 are the same as conductive spacers 802, previously cured and hardened. In an exemplary embodiment of the invention, after conductive spacers 802 have cured, a second coating of conductive adhesive 1004 is applied (404) on top of conductive spacers 802. In an exemplary embodiment of the invention, conductive spacers 802 are hard and conductive adhesive 1004 is still elastic. Optionally, enough conductive adhesive 1004 is applied to adhere PCB substrate electrical pads to the hardened conductive spacers 802 and establish an electrical connection between conductive spacers 802, and thus their underlying electric pads 1006 and the PCB substrate electric pads. Optionally, conductive adhesive 1004 is applied (404) to electric pads on a PCB substrate (not shown) and then the PCB substrate electric pads are mated to electric pads 1006 via conductive spacers 802. Optionally, conductive adhesive 1004 is applied (404) to both PCB substrate electric pads and conductive spacers 802.

While not shown in any of the attached Figures, screen printing can be used as a method of dispensing the conductive adhesive on the electric pads. Screen printing is an optionally useful technique for applying a moderate amount of conductive adhesive to all the electric pads of the designated substrate or surface at one stroke. A stencil or screen is overlaid on the electric pads whereby a gap in the stencil positioned above each electric pad permits adhesive to become deposited thereon when adhesive is applied to the stencil. Once the stencil is removed, the conductive adhesive that went through the gaps remains on the electric pads. Optionally, screen printing can be used as a method of dispensing the non-conductive adhesive on the PCB substrate and/or the sensor substrate in the same process.

Figure 11:
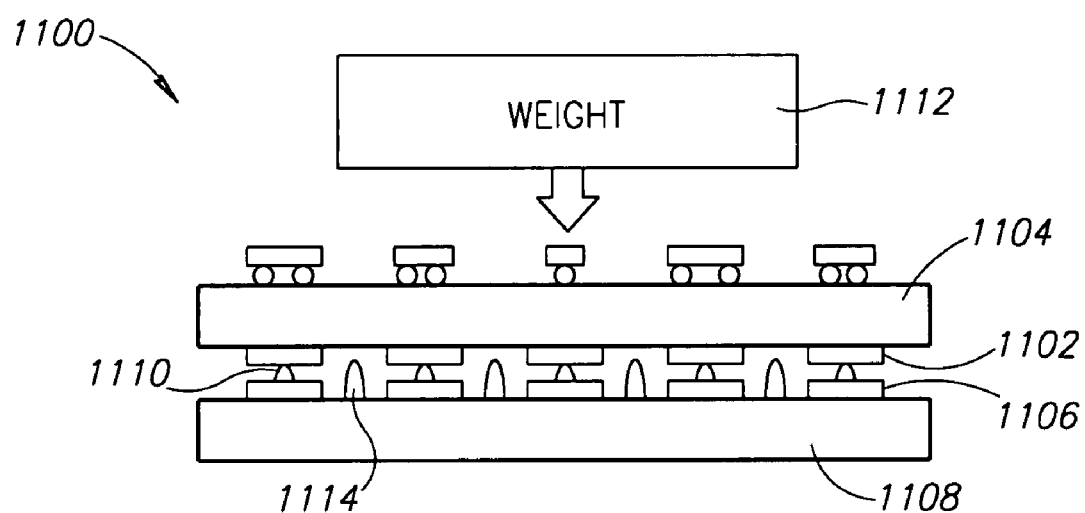
FIG. 11 is a side view of a non-conductive spacer embodiment showing a PCB mated to a sensor array prior to curing, in accordance with an exemplary embodiment of the invention.

FIG. 11 is side view 1100 of a non-conductive spacer embodiment showing a PCB substrate 1104 aligned (406) with a sensor array 1108 in preparation for connecting (408) them together, in accordance with an exemplary embodiment of the invention. Alignment is optionally performed by matching electric pads 1102 on PCB substrate 1104 with corresponding electric pads 1106 on sensor array 1108. In some exemplary embodiments of the invention, PCB substrate 1104 and sensor array 1108 are connected (408) together using a conductive adhesive 1110. Optionally, conductive adhesive 1110 is the same as conductive adhesive 804 applied (404) in FIG. 8. In some exemplary embodiments of the invention, a force or pressure is applied to PCB substrate 1104 to force PCB substrate 1104 and sensor array 1108 together. Optionally, a weight 1112 is used to exert the force or pressure. Optionally, a vise is used to exert the pressure. It should be noted that pressure can be exerted on PCB substrate 1104 towards sensor array 1108, on sensor array 1108 towards PCB substrate 1104, or any combination of both. In some exemplary embodiments of the invention, the exerted force causes PCB substrate 1104 and sensor array 1108 to come together, separated by non-conductive spacers 1114. Conductive adhesive 1110 is compressed between electric pads 1102, 1106 establishing an electrical and mechanical connection between them.

In an exemplary embodiment of the invention, non-conductive spacers 1114, and proper application of conductive adhesive amounts, prevent excess conductive adhesive 1110 from flowing laterally from one electric pad to another electric pad on the same substrate, thereby avoiding creation of lateral conduction. It should also be noted that thin, long components like PCB substrate 1104 are often prone to warping before, during and after their manufacture. In some exemplary embodiments of the invention, using a force, such as weight 1112, on PCB substrate 1104 helps to planarize PCB substrate 1104 and in some embodiments of the invention, the combined structure of PCN substrate 1104 and sensor array 1108.

Figure 12:
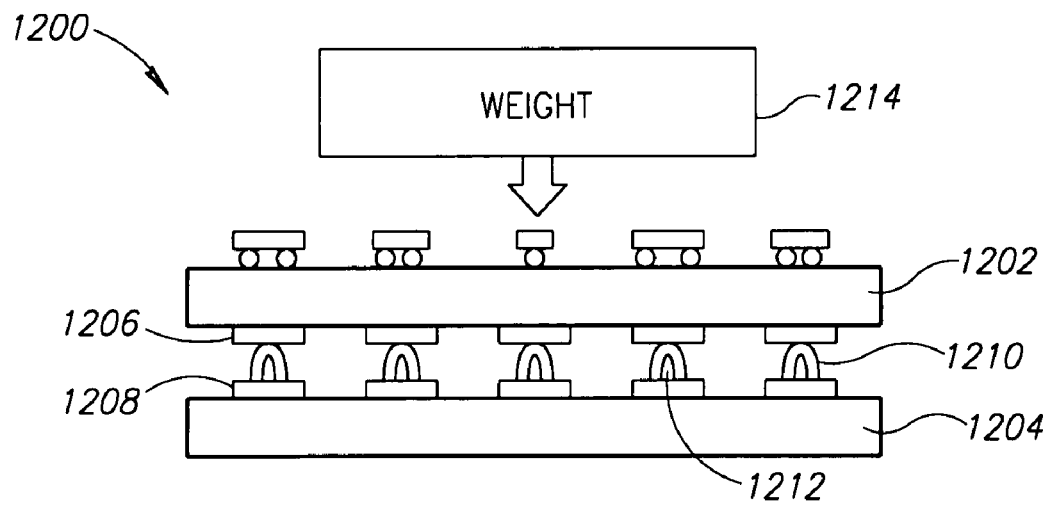
FIG. 12 is a side view of a conductive spacer embodiment showing a PCB mated to a sensor array prior to curing, in accordance with an exemplary embodiment of the invention.

FIG. 12 is side view 1200 of a conductive spacer embodiment showing a PCB substrate 1202 aligned (406) for connecting (408) to a sensor array 1204, in accordance with an exemplary embodiment of the invention. Electric pads 1206 of PCB substrate 1202 are aligned (406) opposite corresponding electric pads 1208 on sensor array 1204. In an exemplary embodiment of the invention, PCB substrate 1202 is connected (408) to sensor array 1204 by using a conductive adhesive 1210 to adhere them together. Optionally, conductive adhesive 1210 is conductive adhesive 1004 previously applied (404), as in FIG. 10. PCB substrate 1202 is then pressed against sensor array 1204 in order to connect (408) them electrically and mechanically, in accordance with an exemplary embodiment of the invention. Optionally, a weight 1214 is used to press PCB substrate 1202 and sensor array 1204 together. Pre-formed and hardened conductive spacers 1212 ensure a certain spacing between PCB substrate 1202 and sensor array 1204 according to a height dimension of conductive spacers 1212. Optionally, conductive spacers 1212 are conductive spacers 902, as described with respect to FIG. 9, however they can be performed by any method known in the art.

In an exemplary embodiment of the invention, the gap enforced between PCB substrate 1202 and sensor array 1204 by conductive spacers 1212 prevents conductive adhesive 1210 from spreading sideways in a way that would cause lateral conductance between electric pads on the same substrate. The spacers allow for using only a small amount of epoxy and provide the necessary support for the gap which avoids lateral spread. In some exemplary embodiments of the invention, pressure is applied from PCB substrate 1202 towards sensor array 1204. Optionally, pressure is applied from sensor array 1204 towards PCB substrate 1202. Optionally, pressure is applied as a combination from both PCB substrate 1202 and sensor array 1204.

Figure 13:
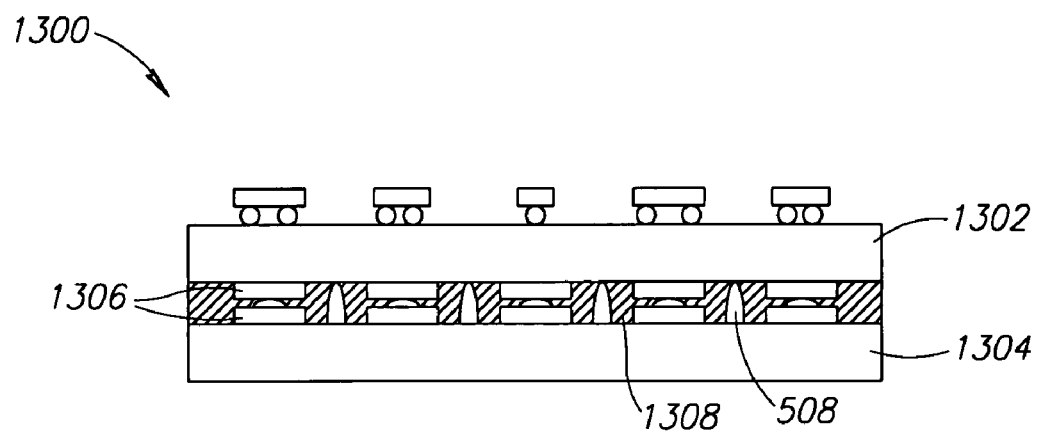
FIG. 13 is a side view of a connected PCB and sensor array with the gaps therebetween filled in, in accordance with an exemplary embodiment of the invention.

Referring to FIG. 13, a side view 1300 is shown of a PCB substrate 1302 and a sensor array 1304 after a curing process, in accordance with an exemplary embodiment of the invention. The embodiment shown is that of the non-conductive spacers 508 from FIG. 5A, however, it should be noted that in some exemplary embodiments of the invention, the non-conductive spacers have a different configuration (FIG. 7) or conductive spacers (FIG. 9) are used. In an exemplary embodiment of the invention where conductive spacers are used, the first and second coats of conductive adhesive are optionally unified into a single solid conductive mass as a result of curing. No matter the type of spacer used, by this time electrical contact is established between the electric pads 1306 of PCB substrate 1302 and sensor array 1304. However, in some exemplary embodiments this structure is mechanically fragile since PCB substrate 1302 and sensor array 1304 are connected solely at electric pads 1306.

In an exemplary embodiment of the invention, the structure of PCB substrate 1302 and sensor array 1304 is reinforced mechanically by filling (410) the gaps between PCB substrate 1302 and sensor array 1304 with a non-conductive adhesive 1308. After a final curing process, non-conductive adhesive 1308 hardens and the entire structure is rendered more mechanically stable, in accordance with an exemplary embodiment of the invention. Optionally, Epo-Tek 302 is used as non-conductive adhesive 1308. The non-conductive adhesive is optionally filled with silica or other non-conductive materials for better mechanical properties. Other embodiments may use different types of non conductive materials to supply mechanical stability to the structure.

It should be noted that although this method is described in the context of securing a PCB to a sensor array, this method can be utilized in order to create electric contacts between different components, modules and substrate materials. For example, two sensor arrays could be connecting using the disclosed methods.

Exemplary Methods for Manufacturing a Sensor Assembly

Figure 14:
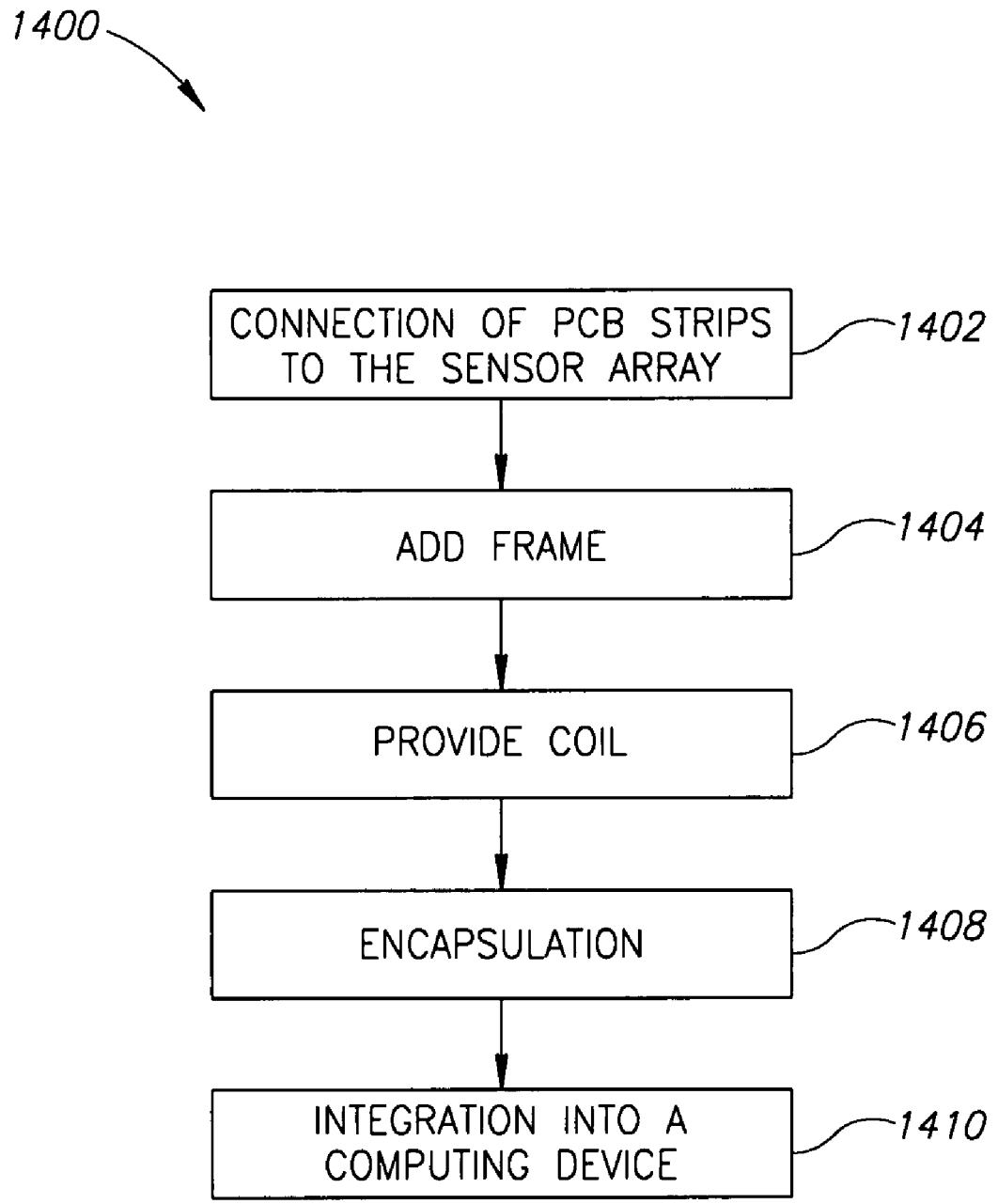
FIG. 14 is a flowchart showing an exemplary method for manufacturing a sensor assembly, in accordance with an exemplary embodiment of the invention.

Referring to FIG. 14, a flowchart 1400 is depicted showing an exemplary method for manufacturing a sensor assembly, in accordance with an exemplary embodiment of the invention. In some exemplary embodiments of the invention, at least one PCB substrate is connected (1402) to a sensor array. Optionally, the connection (1402) is accomplished according to any of the methods described with respect to FIGS. 5A-13. Optionally, the connection is mechanical and/or electrical. A frame is added (1404) to the assembly once the PCB substrates are connected (1402) to the sensor array, in some exemplary embodiments of the invention. In some exemplary embodiments of the invention, a peripheral coil is provided (1406) to the assembly, in accordance with an exemplary embodiment of the invention. Optionally, the peripheral coil is situated within a recess on the frame. Optionally, the peripheral coil is wound onto the frame. Optionally, the peripheral coil is situated on the PCB substrate. In some exemplary embodiments of the invention, gaps within the assembly are filled in with a non-conductive adhesive, thereby encapsulating (1408) the sensor assembly. Optionally, encapsulating (1408) is performed to provide better stability to the sensor assembly. Optionally, encapsulating (1408) is performed to help secure the peripheral coil in its place. In an exemplary embodiment of the invention, the sensor assembly is integrated (1410) into another device, such as a personal computer.

Figure 15:
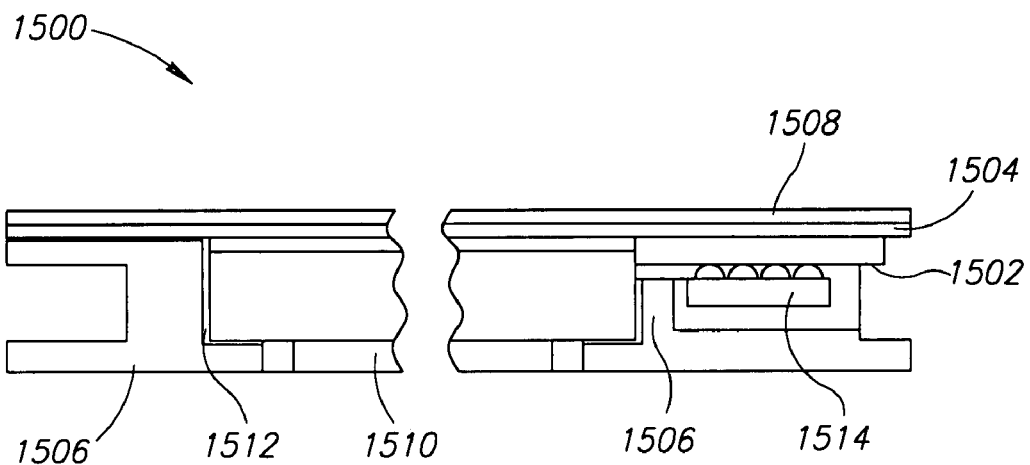
FIG. 15 is a cross-sectional view of a framed sensor array with connected PCBs, in accordance with an exemplary embodiment of the invention.

FIG. 15 shows a cross-sectional view of a framed sensor array 1500 with at least one PCB substrate 1502 connected (1402) to a sensor array 1504, in accordance with an exemplary embodiment of the invention. The added (1404) frame 1506 optionally provides mechanical stability to the sensor assembly and/or optionally provides a place for a peripheral coil to be positioned and in some exemplary embodiments of the invention helps align the sensor assembly with another device, such as a personal computer. In some exemplary embodiments of the invention, a hard protective layer 1508 is provided to the sensor assembly to protect sensor array 1504. Optionally, a non-conductive adhesive is applied in a gap 1512 between a sensor support 1510 and frame 1506. In some exemplary embodiments of the invention, the non-conductive adhesive can be applied either to frame 1506 and/or sensor support 1510 before both parts are attached. In an exemplary embodiment of the invention, frame 1506 is adapted to accommodate PCB substrate 1502 and any electronic components 1514 that are assembled on it. Optionally, frame 1506 is designed to support sensor support 1510 and counteract pressure that is applied to hard protective layer 1508 of sensor array 1504. In an exemplary embodiment of the invention, frame 1506 is transparent, which allows the use of a UV curable adhesive such as Dymax 3069. Optionally, after frame 1506 is added (1404) to the sensor assembly the adhesive is cured and frame 1506 is firmly attached to sensor array 1504 and PCB substrate 1502.

Figure 16:
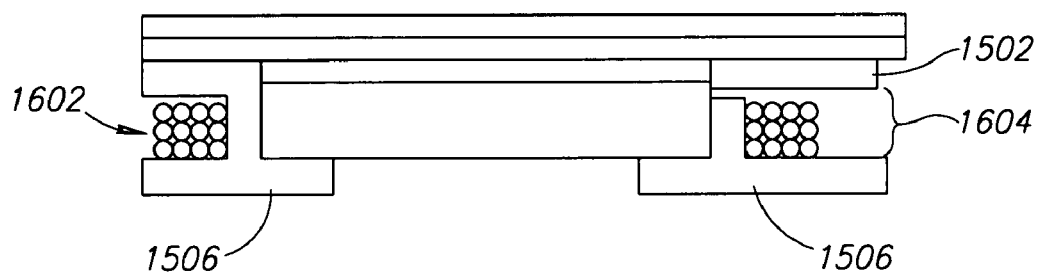
FIG. 16 is a cross-sectional view of a peripheral coil located in a recess in a frame, in accordance with an exemplary embodiment of the invention; and, FIG. 17 is a side view of a sensor assembly with the gaps filled in, in accordance with an exemplary embodiment of the invention.

FIG. 16 is a cross-sectional view 1600 of a peripheral coil 1602 provided (1406) in a recess 1604 on frame 1506, in accordance with an exemplary embodiment of the invention. As described in U.S. Pat. No. 6,690,156 and U.S. patent application Ser. No. 10/649,708, peripheral coil 1602 can be used to supply energy to an electromagnetic stylus and/or game pieces and/or other physical objects. However, in accordance with an exemplary embodiment of the invention, if peripheral coil 1602 is not required, providing (1406) is optionally omitted. Optionally, peripheral coil 1602 is located elsewhere in the sensor assembly. In an exemplary embodiment of the invention, peripheral coil 1602 is comprised of a copper wire coated with insulating material, such as insulating varnish. Other embodiments may utilize other types of conductive wires.

In an exemplary embodiment, peripheral coil 1602 is wound about frame 1506. A recess 1604 within frame 1506 provides a convenient place to locate peripheral coil 1602 around the sensor array. In some exemplary embodiments of the invention, peripheral coil 1602 is connected to at least one of the PCB substrates 1502. Optionally, this connection is made to supply peripheral coil 1602 with power. Optionally, a gap in frame 1506 allows access to two electric pads on one of the PCB substrates 1502. A first end of peripheral coil 1602 is connected to a first electric pad, and the second end of peripheral coil 1602 is connected to a second electric pad, in accordance with an exemplary embodiment of the invention. Other embodiments may use a different configuration to connect the peripheral coil to the power supply.

Figure 17:
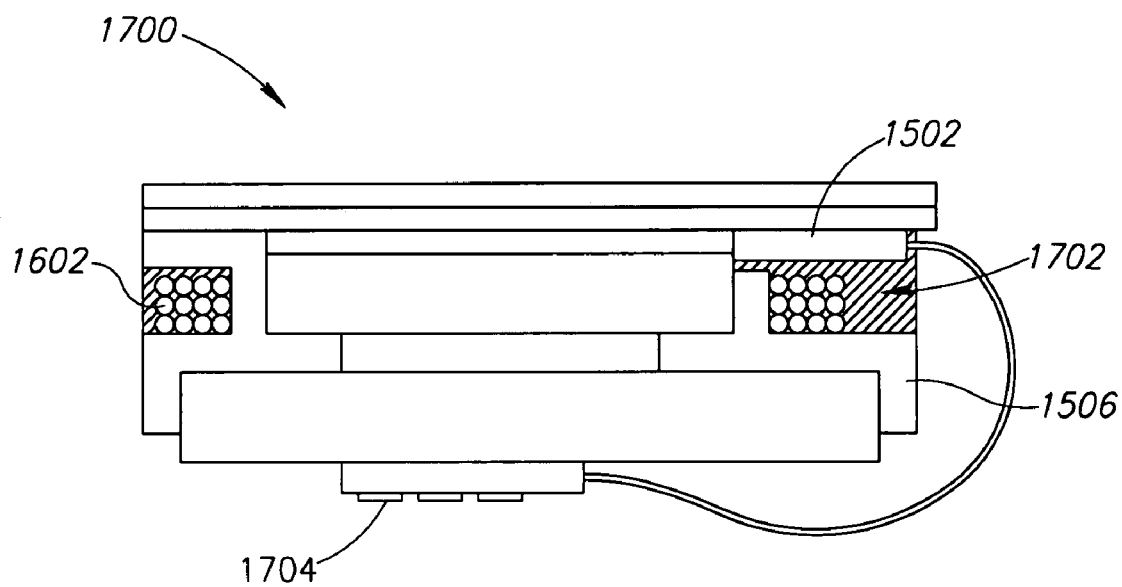

A cross-sectional view of a sensor assembly 1700 is shown in FIG. 17, in accordance with an exemplary embodiment of the invention. In some exemplary embodiments of the invention, upon the provision (1406) of peripheral coil sensor assembly 1700 is essentially complete. In order to improve the mechanical stability of sensor assembly 1700 and/or to secure peripheral coil 1602 in position, air gaps within sensor assembly 1700 are filled with a non-conductive adhesive 1702. In some exemplary embodiments of the invention, this filling serves to encapsulate (1408) sensor assembly 1700. Non-conductive adhesive 1702 is inserted into all the air gaps between frame 1506 and PCB substrate 1502 as well as the gaps in and around peripheral coil 1602.

In an exemplary embodiment of the invention, frame 1506 helps integrate (1410) sensor assembly 1700 with another device, such as an LCD screen. Optionally, frame 1506 is used to align the sensor array with a viewing area of an LCD. In an exemplary embodiment of the invention, frame 1506 is provided with extensions 1706 which are designed to fit frame 1506 to the LCD screen. In some exemplary embodiments of the invention, ribs (not shown) are provided to frame 1506 and overlap screw holes in the LCD. Thus, a screw through a rib and into the screw hole in the LCD secures frame 1506 to the LCD. Other embodiments may utilize different techniques, or combine them, in order to secure the sensor assembly to another device in an aligned configuration.

In an exemplary embodiment of the invention, PCB substrates 1502 are connected to a controller 1704. Optionally, this connection is via a flex cable. Other embodiments may assemble a controller directly on PCB substrates 1502. In some exemplary embodiments of the invention, sensor assembly derived information is transferred to a host device by a simple electrical connection such as a USB connection. Optionally, the PCBs and/or the frame include some or all of the electronic components of a digitizer.

The present invention has been described using non-limiting detailed descriptions of embodiments thereof that are provided by way of example and are not intended to limit the scope of the invention. It should be understood that features and/or steps described with respect to one embodiment may be used with other embodiments and that not all embodiments of the invention have all of the features and/or steps shown in a particular figure or described with respect to one of the embodiments. Variations of embodiments described will occur to persons of the art. Furthermore, the terms "comprise," "include," "have" and their conjugates, shall mean, when used in the disclosure and/or claims, "including but not necessarily limited to."

It is noted that some of the above described embodiments may describe the best mode contemplated by the inventors and therefore may include structure, acts or details of structures and acts that may not be essential to the invention and which are described as examples. Structure and acts described herein are replaceable by equivalents, which perform the same function, even if the structure or acts are different, as known in the art. Therefore, the scope of the invention is limited only by the elements and limitations as used in the claims.

The invention claimed is:

1. A method for connecting substrates having electrical conductive elements thereon, comprising:
    providing at least one spacer between said substrates, wherein said at least one spacer is spaced away from the conductive elements,
    applying a conductive material to at least one of said electrical conductive elements;
    aligning said electrical conductive elements;
    connecting said substrates by urging them together, wherein said at least one spacer prevents lateral spreading of said conductive material on said substrates from bridging a distance between adjacent conductive elements during said connecting by providing a counter acting force to the urging and wherein said at least one spacer determines a distance between said substrates; and
    filling in gaps between said substrates.

2. A method according to claim 1, wherein said gaps are filled in with a non-conductive adhesive.

3. A method according to claim 1, wherein at least one said substrates is a PCB.

4. A method according to claim 1, wherein at least one said substrates is a sensor array.

5. A method according to claim 1, wherein said at least one spacer is non-conductive.

6. A method according to claim 5, wherein said at least one non-conductive spacer is planar.

7. A method according to claim 5, wherein said at least one non-conductive spacer is elongate.

8. A method according to claim 6 wherein the planar spacer prevents lateral spread by blocking said spread.

9. A method according to claim 1, wherein said electrical conductive elements are pads.

10. A method according to claim 1, wherein said urging is performed by a weight.

11. A method according to claim 1, wherein said urging planarizes at least one of said substrates by conforming said electrical component to the at least one spacer.

12. A method according to claim 1, wherein said conductive material is at least one of a conductive adhesive and a conductive epoxy.

* * * * *